United States Patent [19]
Zarubinsky et al.

[11] Patent Number: 6,028,544
[45] Date of Patent: Feb. 22, 2000

[54] DIGITAL-TO-ANALOG CONVERTER WITH NOISESHAPING MODULATOR, COMMUTATOR AND PLURALITY OF UNIT CONVERTERS, AND METHOD

[75] Inventors: Michael Zarubinsky, Jerusalem; Vladimir Koifman, Rishon-Lezion; Yachin Afek, Kfar Saba, all of Israel

[73] Assignee: Motorola, Inc., Schaumburg, Ill.

[21] Appl. No.: 09/002,421

[22] Filed: Jan. 2, 1998

[51] Int. Cl.[7] .................................................. H03M 3/00
[52] U.S. Cl. .......................................... 341/143; 341/141
[58] Field of Search .................................. 341/144, 143, 341/141, 50, 61, 122

[56] References Cited

U.S. PATENT DOCUMENTS

| | | | |
|---|---|---|---|
| 5,227,787 | 7/1993 | Kurashina | 341/61 |
| 5,537,113 | 7/1996 | Kawabata | 341/141 |
| 5,606,319 | 2/1997 | Yatim et al. | |
| 5,768,316 | 6/1998 | Sogo | 375/260 |
| 5,831,565 | 11/1998 | Akune | 341/143 |
| 5,880,687 | 3/1999 | May et al. | 341/61 |
| 5,889,482 | 3/1999 | Zarubinsky et al. | 341/131 |

OTHER PUBLICATIONS

Richard L. Carley, Richard Schreier, and Gabor C. Temes: "Delta–Sigma ADCs with Multibit Internal converters", published in 1997 as Chapter 8 (pp. 244–264) of the following book: Nortsworthy, Steven R.; Schreier R.; Temes G. C. (editors): "Delta–Sigma Data Converters: theory, design, and simulation", IEEE Press, Piscataway 1997, ISBN, 0–7803–1045–4).

Gabor C. Temes, Shaofeng Shu, and Richard Schreier: "Architectures for ΔΣ DACs" published in 1997 as chapter 10 (pp. 309–332) of the following book: Nortsworthy, Steven R.; Schreier R.; Temes G. C. (editors): "Delta–Sigma Data Converters: theory, design, and simulation", IEEE Press, Piscataway 1997, ISBN 0–7803–1045–4).

Mike Rebeschini and Paul F. Ferguson, Jr.: "Analog–Circuit Design for Delta–Sigma DACs" published in 1997 as chapter 12 (pp. 380–405) of the following book: Nortsworthy, Steven R.; Schreier R.; Temes G. C. (editors): "Delta–Sigma Data Converters: theory, design, and simulation", IEEE Press, Piscataway 1997, ISBN 0–7803–1045–4).

Proakis, J. G., Manolakis, D. G.: "Digital Signal Processing", Prentice Hall Upper Saddle River, New Jersey, 1996, ISBN 0–13–373762–4. chapter 3, pp. 151–229.

*Primary Examiner*—Brian Young
*Assistant Examiner*—Peguy JeanPierre

[57] ABSTRACT

A digital-to-analog converter (200) has a first portion (208) which receives a digital input signal X (201') and has serially coupled a second portion (209) which provides an analog output signal Y (202'). The first portion (208) is a delta-sigma modulator with integrators (210 and 215), adders (203 and 205), a comparator (220) and delay stages (230 and 235). The second portion (209) comprises a commutator (260), unit converters (280-n) and an analog adder (290). In the second portion, the unit converters (280-n) can be mismatched. The first portion (208) provides a noise-shaped intermediate signal V (221') which has substantially zero noise at that frequencies where the mismatches would lead to unwanted spectral tones.

20 Claims, 6 Drawing Sheets

DIGITAL-TO-ANALOG CONVERTER WITH NOISESHAPING MODULATOR, COMMUTATOR AND PLURALITY OF UNIT CONVERTERS, AND METHOD

FIELD OF THE INVENTION

The present invention generally relates to data conversion systems, and, more particularly to oversampling data converters for performing digital-to-analog conversion.

BACKGROUND OF THE INVENTION

Recently, there has been an increased demand for further reduion in the size, cost, and complexity of electronic circuits used for transmission f analog voice, digital voice, and highspeed data over various types of communicatn channels. This increased demand has resulted in significant improvements in the development of integrated circuits conversion between analog and digital signals and vice versa. Delta-sigma (ΔΣ) converters are known in the art since the early 1960s. ΔΣ converters conveniently employ oversampling techniques. Analog signals y in frequencies bands between f=0 to f=f=$f_{max}$ are represented as digital signals x by sampling rates F which are higher then the Nyquist rate (2*$f_{max}$):

$$F=N*(2*f_{max}) \quad (1)$$

with symbol * for multiplication and factor N as an oversampling ratio. ΔΣ converters can be used as analog-to-digital converters (ADC) and as digital-to-analog converters (DAC). For the application of ΔΣ converters and for prior art designs, the following references arc useful:

[1] Nortsworthy, Steven R.; Schreier R.; Temes G. C. (editors): "Delta-Sigma Data Converters: theory, design, and simulation", IEEE Press, Piscataway 1997, ISBN 0-7803-1045-4, especially chapter 8 (pages 244–264) "Delta-Sigma ADCs with Multibit Internal converters", chapter 10 (pages 309–332) "Architectures for ΔΣ DACs", chapter 12 (pages 380–405) "Analog-Circuit Design for Delta-Sigma DACs"; and

[2] Proakis, J. G., Manolakis, D. G.: "Digital Signal Processing", Prentice Hall Upper Saddle River, N. J., 1996, ISBN 0-13-373762-4.

Figure 1:
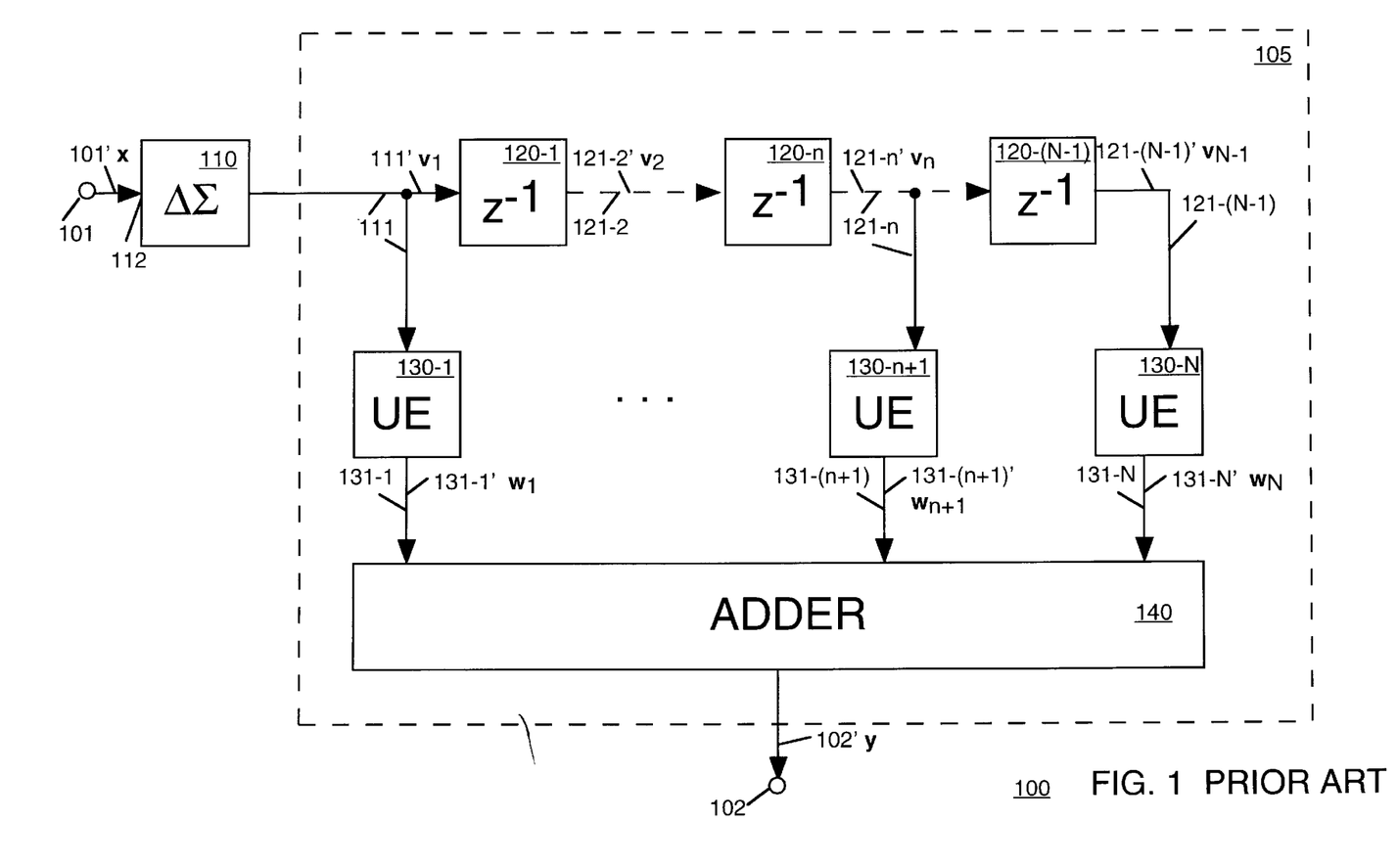
FIG. 1 illustrates a simplified block diagram of a digital-to-analog converter known in the prior art.

FIG. 1 illustrates a simplified block diagram of digital-to-analog converter 100 (hereinafter converter 100) known in the prior art. Converter 100 comprises sigma-delta modulator 110 (hereinafter modulator 110), delay units 120-n (n=1 to N−1), one-bit digital-to-analog converters 130-n (n=1 to N), and adder 140. N is the above mentioned oversampling ratio. In FIG. 1, converters 130-n are identified by the letters "UE" standing for "unit element", i.e. a one-bit converter. Delay units 120-n form a hift register.

Converter 100 receives digital input signal x at input terminal 101 and provides nalog output signal y at output terminal 102. Input terminal 101 is coupled to input 112 of modulator 110. Modulator 110 is coupled to delay stage 120-1 via line 111. or n=1 to n=(N−2), delay stage 120-n is coupled to delay stage 120-(n+1) via line 121-n. Line 111 is coupled to converter 130-1 and line 121-n is coupled to converter 130-(n+1). Converter 130-n is coupled to adder 140 via line 131-n. Delay units 120-n, converters 130-n, and adder 140 form block 105. In FIG. 1, signals are identified by primed reference numbers corresponding to the reference numbers of the lines and terminals. Modulator 110 receives digital input signal x (101') at input terminal 101 and provides intermediate signal $v_1$ (111') at line 111. Conveniently, input signal x is a multibit signal and signal $v_1$ is a stream of single bits. For example, signal $v_1$ can have binary logical values "1" and "0". Delay stage 120-n receives signal $v_{n-1}$ (121'-(n−1)) at line 121 -(n−1) and provides signal $v_n$ at line 121-n after a delay time T. The delay time T is a reciprocal representation of the sampling rate F:

$$T=1/F. \quad (2)$$

wherein the slash/stands for division. In terms of the z-transformation (explained for example, in chapter 3 of [2]), signal $v_{n+1}$ can be expressed as a multiplication of $v_n$ with the operator $z^1$:

$$v_n(z)=z^{-1}*v_{n-1}(z) \quad (3)$$

Converter 130-n receives $v_n$ (121'-n) at line 121-n and provides analog signal $w_n$ (131'-n) at line 131'-n. Adder 140 substantially simultaneously receives signals $w_1$ to $w_N$ and combines them to analog output signal y (102') on output terminal 102.

Various modification of converter 100 are known in the art. Converters 130-n of converter 100 operate at the high sampling rate F. This limits the precision of converter 100 and adds noise.

Preferably, converters 130-1 to 130-N have substantially equal transfer functions. For example, digital signals $v_1$="1" to $v_N$="1" cause converters 130-1 to 130-N to provide substantially equal analog signals $w_1$ to $w_N$:

$$w_1 \approx w_2 \approx w_n w_N \quad (4)$$

However, manufacturing variations lead to mismatches between converters 130-1 to 130-N. Mismatch is represented by differences Δw between analog signals $w_n$, such as:

$$\Delta w=w_n-w_{n+1} \quad (5)$$

Such variations are due to, for example, limitations in the lithographic resolution. Differences Δw are unconvenient, because they cause distortions in the transfer function.

Figure 2:
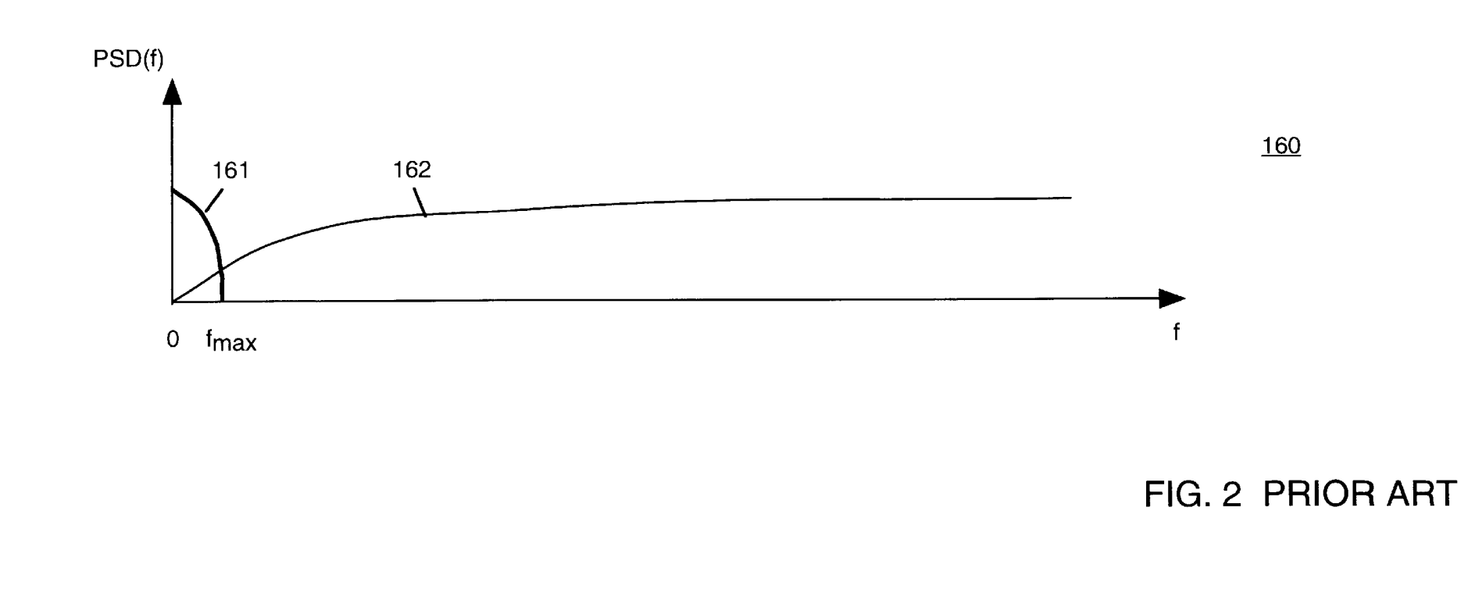
FIG. 2 illustrates a simplified spectrum diagram for a modulator of the converter of FIG. 1.

FIG. 2 illustrates simplified spectrum diagram 160 for modulator 110 of prior art converter 100 (FIG. 1). Diagram 160 illustrates the power spectral density (PSD) of signal $v_1$ on a vertical axis versus increasing frequency f on a horizontal axis. Spectrum representations arc well known in the art. A person of skill in the art is able to measure such spectra without the need for further explanation.

Trace 161 symbolizes the PSD of a signal component of $v_1$ with useful information, e.g., voice, between f=0 and a maximum frequency $f_{max}$. Trace 162 symbolizes the PSD of the noise component of $v_1$, hereinafter "modulator noise". It is known in the art to cancel the modulator noise by filters coupled to output terminal 102. The modulator noise can have substantially constant amplitude for large frequency range (so-called "white noise"). The literature (e.g., [1]) teaches noise shaping technologies. For example, a PSD amplitude can be increased with the frequency f.

The present invention seeks to provide digital-to-analog converters which mitigate or avoid the above mentioned and other disadvantages and limitations of the prior art.

BRIEF DESCRIPTION OF THE DRAWINGS

FIGS. 3–4 illustrates a simplified block diagram of a digital-to-analog converter in a preferred embodiment of the present invention, wherein FIG. 3 illustrates a modulator and FIG. 4 illustrates a block;

DETAILED DESCRIPTION OF A PREFERRED EMBODIMENT

A converter of the present invention has first portion (e.g., modulator 208) which receives an incoming signal and serially coupled second portion (e.g., analog comb filter 209) which provides an outgoing signal. The first portion is a modulator which introduces modulator noise. Due to mismatching elements, the second portion can introduce unwanted spectral tones at tone frequencies. The modulator noise has minimum or substantially zero energy at that tone frequencies. Compared to the prior art, the second portion has less energy to generate spectral tones. The present invention has a series of advantages, among them: (a) The sampling rate (e.g., F) can be reduced. (b) Noise which is introduced by mismatching elements can be substantially canceled. The signal-to-noise ratio (SNR) is increased.

In the following, signals are abbreviated by uppercase letters, such as, e.g., "X", "Y", and "V". The letters correspond to the lowercase letters used for signals in the background section. However, their function is different as a consequence of the embodiment of the present invention which will be explained in the following.

Figure 3:
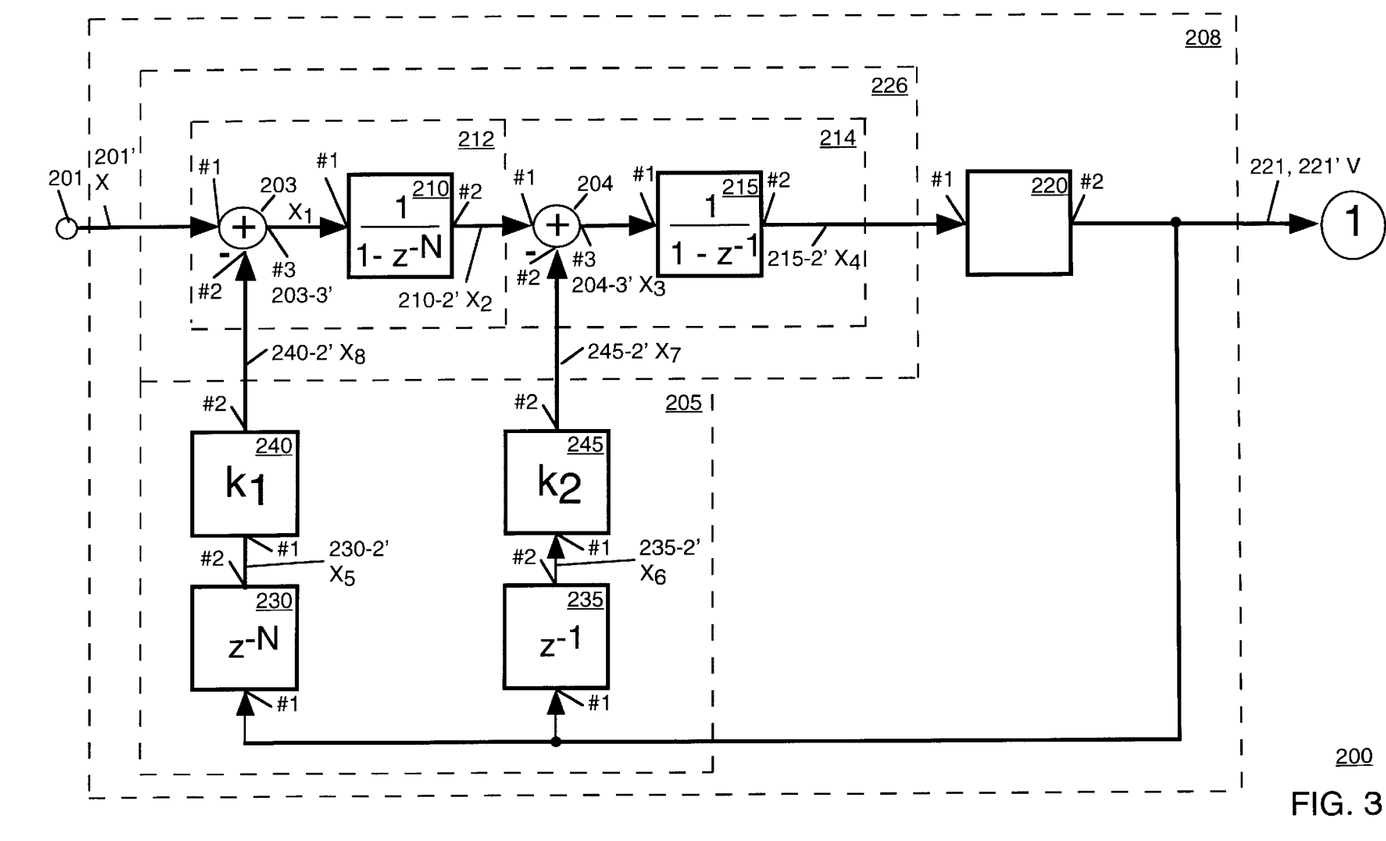
Figure 4:
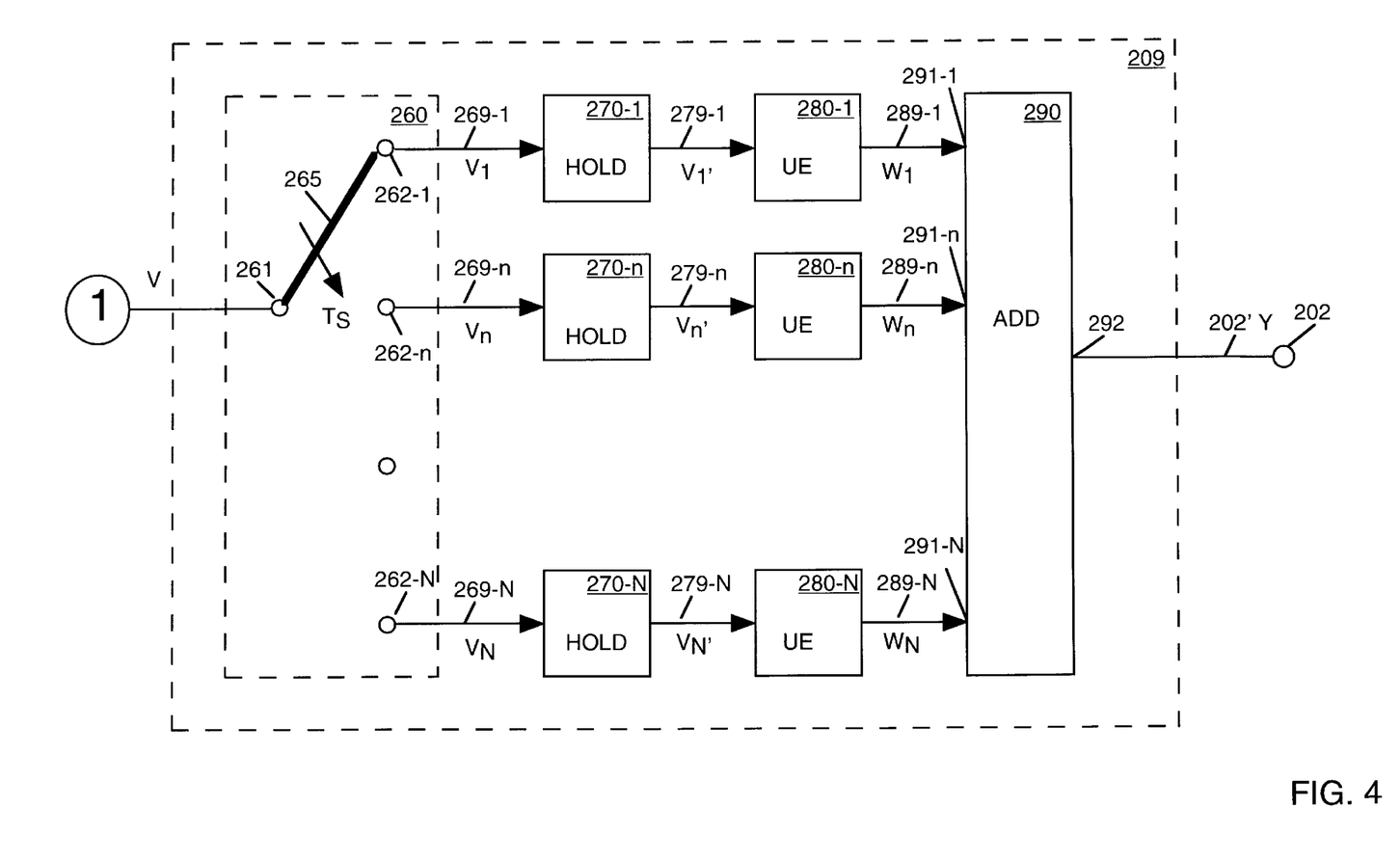

FIGS. 3–4 illustrates a simplified block diagram of digital-to-analog converter 200 (hereinafter converter 200) in a preferred embodiment of the present invention. FIG. 4 is a continuation of FIG. 3 coupled at ①. Converter 200 comprises modulator 208 (outer dashed enclosure FIG. 3) and analog comb filter 209 (outer dashed enclosure in FIG. 4). Converter 200 receives digital input signal X (201') at input terminal 201 of modulator 208 and provides analog output signal Y (202') at output terminal 202 of analog comb filter 209. The terms "supply" and "provide" used in connection with signals include that components of converter 200 are coupled to each other. FIGS. 3–4 illustrate signals with primed reference numbers corresponding to lines, terminals, input, and outputs.

Modulator 208 is, preferably, a ΔΣ-modulator with the order M≧2. In the example of FIG. 3, modulator 208 is of a second order type (M=2). But this is for convenience of explanation and other orders can also be used. Modulator 208 comprises M=2 integrators 210 and 215, adders 203 and 204, comparator 220 (also "quantizer"), optional attenuators 240 and 245, and M=2 delay stages 230 and 235. Integrator 210 and adder 203 form accumulator 212; and integrator 215 and adder 204 form accumulator 214 (dashed enclosures). Accumulators 212 and 214 form accumulator chain 226 (dashed enclosure). Delay stages 230 and 235 and attenuators 240 and 245 form feedback unit 205 (dashed enclosure). Based on the description herein, persons of skill in the art are able to implement the components of modulator 208 by well known circuitry.

Input terminal 201 supplies signal X (201') to input 203-1 of adder 203. In FIG. 3, input 203-1 is referred to as #1, wherein the symbol # stands for "203". This convention is followed also for other inputs and outputs. Output 203-3 of adder 203 supplies signal $X_1$ (203-3') to input 210-1 of integrator 210. Output 210-2 of integrator 210 supplies signal $X_2$ (210-2') to input 204-1 of adder 204. Output 204-3 of adder 204 supplies signal $X_3$ (204-3') to input 215-1 of integrator 215. Output 215-2 of integrator 215 supplies signal $X_4$ (215-2) to input 220-1 of comparator 220. Comparator 220 compares signal $X_4$ to a reference signal (not shown) and provides signal V (221') to analog comb filter 209 on line 221 (placeholder (①)). Delay stage 235 receives signal V at input 235-1 and supplies signal $X_6$ (235-1') on output 235-1 to input 245-1 of attenuator 245. Attenuator 245 receives signal $X_6$ at input 245-1 and supplies signal $X_7$ (245-2') on output 245-2 to input 204-2 of adder 204. Delay stage 230 receives signal V at input 230-1 and supplies signal $X_5$ (230-2') on output 230-2 to input 240-1 of attenuator 245. Attenuator 240 receives signal $X_5$ and supplies signal $X_8$ (240-2') to input 203-2 of adder 203. Delay stage 230 provides a signal delay of the length $T_s$ which has N sampling periods (1/F):

$$T_s = N/F \qquad (6)$$

Using the z-transformation, a transfer function of delay stage 230 can be expressed by:

$$X_5(z) = V(z) * z^{-N} \qquad (7)$$

Attenuator 240 has an attenuation factor $k_1$ and provides $X_8$:

$$X_8(z) = X_5(z) * k_1 \qquad (8)$$

Delay stage 235 provides a signal delay of less then N sampling periods (1/F), or, preferably, a single sampling period:

$$X_6(z) = V(z) * z^{-1} \qquad (9)$$

Attenuator 245 has an attenuation factor $k_2$ and provides $X_7$:

$$X_7(z) = X_6(z) * k_2 \qquad (10)$$

Factors $k_1$ and $k_2$ are collectively referred to a factor k. Factor k has, preferably, a magnitude between substantially equal to 1 (≈) and 2, that is:

$$1 \approx k \approx < 2 \qquad (11)$$

This is convenient for implementing the present invention, but other values k can also be used. In the example of second-order modulator 208, k is around 1 (k≈1).

Integrator 210 integrates signal $X_1$ to $X_2$ with a transfer function H(z):

$$X_2(z) = H_1(z) * X_1(z) = \frac{1}{1 - z^{-N}} * X_1(z) \qquad (12)$$

Integrator 215 integrates signal $X_3$ to $X_4$ with:

$$X_2(z) = \frac{1}{1 - z^{-1}} * X_1(z) \qquad (13)$$

A very important feature of the present invention can be seen on integrator 210 and delay stage 230. A feedback signal (e.g., $X_8$) acts with a delay of N sampling periods (1/F) on the input signal (e.g., X) and is integrated for a substantially equal integration time. Thereby, modulator 208 introduces zeros at the modulator noise of signal V.

Analog comb filter 209 (FIG. 4) comprises distributor or commutator 260, (dashed enclosure), optional hold elements 270-n (n=1 to N), unit converters 280-n (n=1 to N, "UE"), and analog adder 290 ("combiner"). Preferably, distributor 260 has switch 265, common input terminal 261 and output terminals 262-n (n=1 to N). Line 221 coming from modulator 208 (placeholder ①) supplies signal V to terminal 261. Switch 265 of distributor 260 switches signal V to each of unit converters 280-n at time intervals $T_s$. For example, during a single sampling period signal V goes to terminal 262-1 and becomes signal $V_1$, during the next sampling period signal V goes to terminal 262-2 (signal $V_2$), and so on (signals $V_n$). Line 269-n at terminal 262-n supplies signal $V_n$ to optional hold element 270-n. Hold element 270-n keeps $V_n$ at its initial value during N sampling periods and provides $V_n'$. Line 279-n supplies $V_n'$ to unit converter 280-n. Unit converter 280-n converts $V_n'$ into analog signal $W_n$ on line 289-n. Adder 290 receives $W_n$ (n=1 to N) at inputs 291-n and combines analog signals $W_1$ to $W_N$ to analog output signal Y on output terminal 202.

Figure 5:
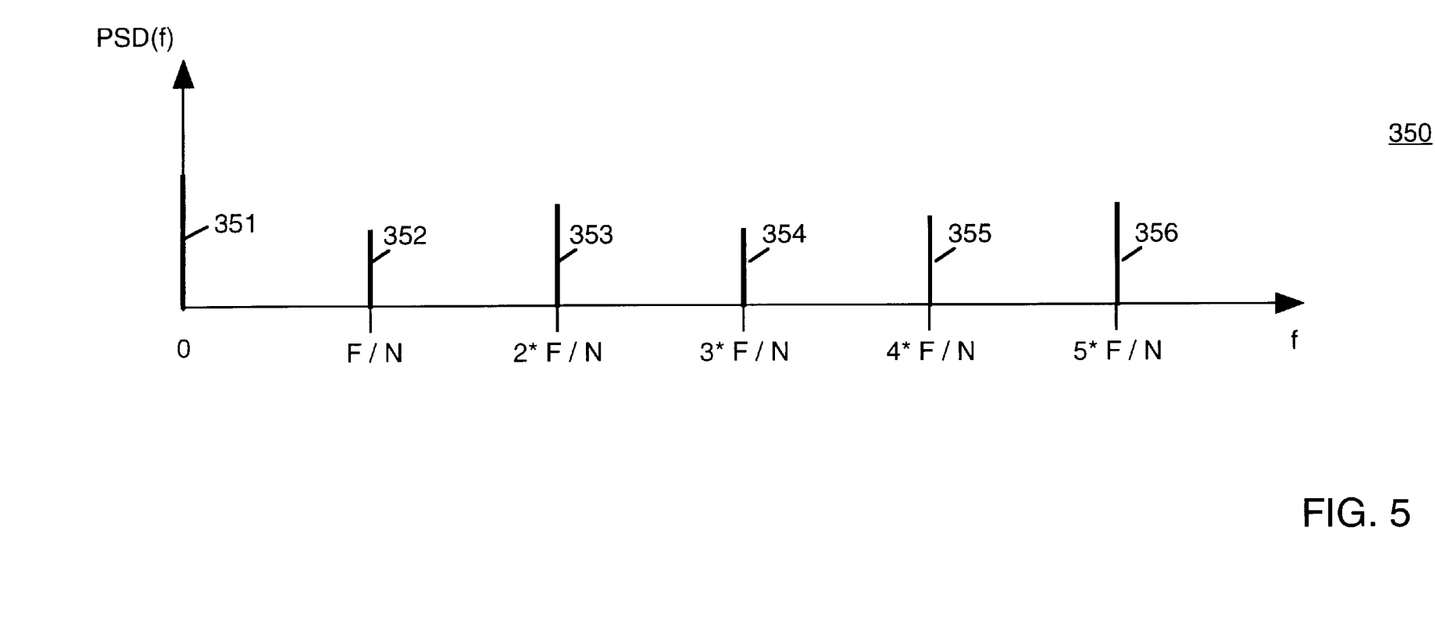
FIG. 5 illustrates a simplified spectrum diagram of the block in the digital-to-analog converter of FIGS. 3–4.

FIG. 5 illustrates simplified spectrum diagram 350 for analog comb filter 209 of converter 200. Diagram 350 illustrates spectral tones (traces 351–356) of parasitic signals which can be imposed on signal V by amplitude modulation. The amplitude of the spectral tones depends on the mismatch between unit converters 280-n. The spectral tones have maximums at tone frequencies $f_q$. The tone frequencies are integer multiples of the sampling rate F divided by the oversampling ratio N:

$$f_q = q*F/N \tag{14}$$

with * (multiplication) and/(division) performed in either order and with q being an integer factor:

$$q=0, 1, 2, 3, \text{etc.} \tag{15}$$

If the modulator noise would be shaped, then analog comb filter 209 would destroy the shape by modulation with spectral tones (e.g., 351–356). To avoid spectral tones at output 202, modulator 208 feeds analog comb filter 209 with such a signal V which is contains all useful information but which is deficient in energy at the frequencies where analog comb filter 209 would otherwise produce spectral tones.

Figure 6:
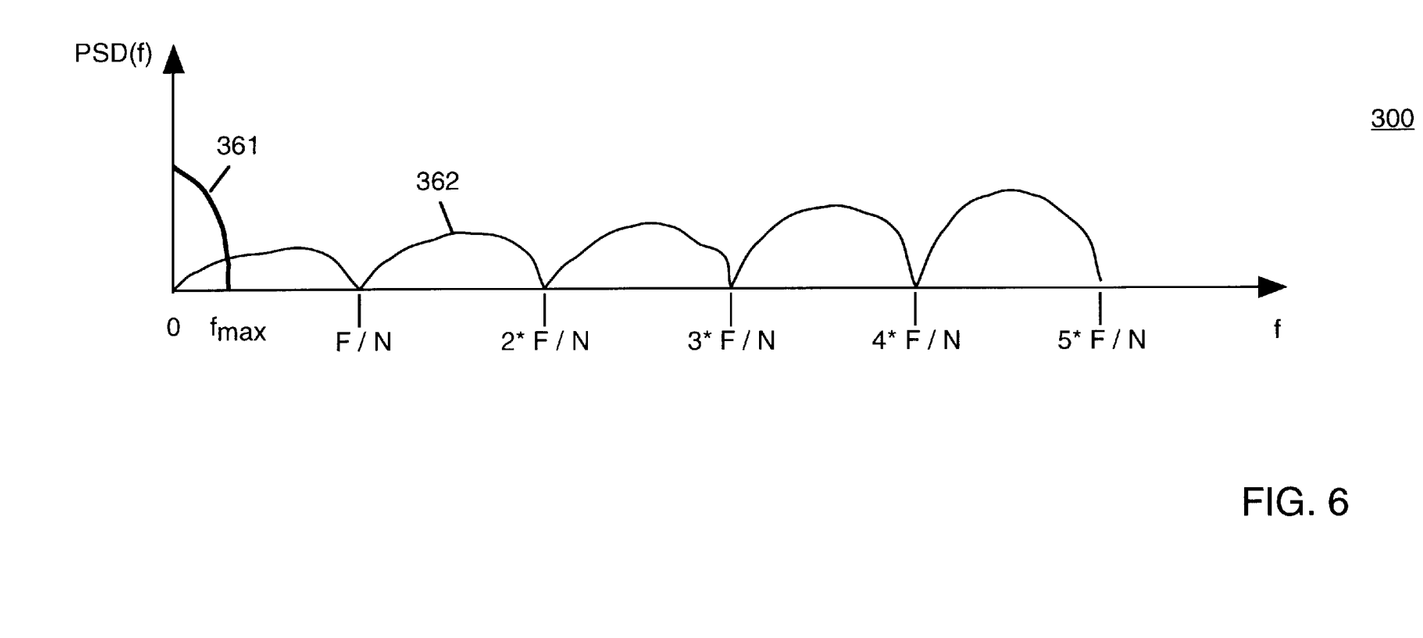
FIG. 6 illustrates a simplified spectrum diagram of the modulator in the digital-to-analog converter of FIGS. 3–4.

FIG. 6 illustrates a simplified spectrum diagram of modulator 208 of digital-to-analog converter 200 of FIGS. 3–4. Trace 361 symbolizes the PSD of the signal component of V with useful information, e.g., voice, between f=0 and a maximum frequency $f_{max}$. Trace 362 symbolizes the PSD of the modulator noise of V. The modulator noise of V has zeros at tone frequencies $f_q$ (Eqs. (14) and (15)).

The transfer function of analog comb filter 209 produces baseband noise from the low energy of V at the tone frequencies. But, this baseband noise can substantially be neglected. Therefore, the spectral tones are not harmful and can be neglected. It is an advantage of the present invention, that expensive filters for tone canceling are not required.

In other words, the present invention can be described as a converter (e.g., converter 200) which comprises: (a) a delta-sigma modulator (e.g., modulator 208) having an accumulator chain (e.g., chain 226) with M accumulators (e.g., 212 and 214), a quantizer (e.g., comparator 220) coupled to the accumulator chain and a feedback unit (e.g., 205), the modulator transforming a first signal (e.g., the digital signal X) to a second signal (e.g., the digital signal V) at a sampling rate F; and (b) a block (e.g., analog comb filter 209) having a multiplexer (e.g., distributor 260), a plurality of N unit converters (e.g., 280-n), and a combiner (e.g., analog adder 290), the multiplexer transforming the second signal to the unit converters at a sampling rate $F_2=F/N$, the converters converting a cyclic sequence (e.g., V to $V_1$, V to $V_2$, ... V to $V_n$ and again V to $V_1$, etc.) of the second signal to third signals (e.g., $W_n$) and the combiner combining the third signals to a fourth signal (e.g., the analog output signal X).

Unit converters 280-n can be implemented, for example, by current sources which are switched on by $V_n$="1" and switched of by $V_n$="0". In general, the current sources represent controllable signals sources. The present invention can also be described as a system which comprises: (i) a first circuit in which N controllable signal sources periodically receive N control signals $V_n$ from a control signal stream V and provide N signal components $W_n$ (n=0 to N-1) of an output signal Y, wherein neighboring signal sources receiving an identical control signal $V_n=V_{n-1}$ provide signal components $W_n$ and $W_{n+1}$ with differences $\Delta W=W_n-W_{n+1}$; and (ii) a second circuit providing the control signal stream V such that each of the control signals $V_n$ shows dither with repetitions in N cycles, so that the influence of the differences $\Delta W$ to a spectrum of the output signal is substantially canceled.

A method of the present invention for converting a digital input signal to an analog output signal has the following steps: (a) receiving the digital input signal X with a first sampling rate F and providing a digital intermediate signal V, thereby providing noiseshaping with zeros at substantially integer multiples of the first sampling rate divided by an oversampling ratio N; (b) cyclically distributing the digital intermediate signal V to N lines; (c) receiving the intermediate signal V during N sampling periods and providing analog intermediate signals; and (d) adding the analog intermediate signals to an analog output signal Y.

The present invention can be used in many telecommunications applications. Converter 200 can be integrated on a monolithic chip. Because of the high SNR, converter 200 can be integrated on a single chip with other signal processing circuits.

While the invention has been described in terms of particular structures, devices and materials, those of skill in the art will understand based on the description herein that it is not limited merely to such examples and that the full scope of the invention is properly determined by the claims that follow.

We claim:

1. A digital-to-analog converter, comprising:

a modulator receiving a digital input signal X with a first sampling rate F and providing a digital intermediate signal V, said modulator providing noiseshaping with zeros at substantially integer multiples of said first sampling rate divided by an oversampling ratio;

a commutator cyclically distributing said digital intermediate signal V to a first plurality of lines whose number corresponds to said oversampling ratio;

a second plurality of unit converters, each of said unit converters receiving said intermediate signal V during sampling periods whose number corresponds to said first plurality of lines and providing an analog intermediate signal; and an analog adder for adding said analog intermediate signals to provide an analog output signal Y.

2. The converter of claim 1 wherein said modulator is a delta-sigma modulator.

3. The converter of claim 1 wherein said modulator comprises an integrator stage having the transfer function:

$$H_1(z) = \frac{1}{1 - z^{-N}}$$

wherein N is the sampling ratio.

4. The converter of claim 1 wherein said modulator comprises a delay stage with a delay of N sampling periods 1/F.

5. A converter comprising:
   (a) a delta-sigma modulator having an accumulator chain with M accumulators, a quantizer coupled to said accumulator chain and a feedback unit, said modulator transforming a first signal to a second signal at a sampling rate F; and
   (b) a block having a multiplexer, a plurality of unit converters, the number of said unit converters being N, and a combiner,
      said multiplexer transforming said second signal to said unit converters at a sampling rate $F_2=F/N$, said plurality of unit converters converting a cyclic sequence of said second signal to third signals and said combiner combining said third signals to a fourth signal.

6. The converter of claim 5 wherein at least one of said M accumulators is coupled to a delay stage of N/F.

7. The converter of claim 5 wherein said feedback unit feeds said second signal back to one of said accumulators with a delay of N/F.

8. The converter of claim 5, wherein said number M of accumulators is $M \geq 2$.

9. The converter of claim 5 wherein said first signal is a digital signal and said fourth signal is an analog signal.

10. The converter of claim 5 wherein said delta-sigma modulator provides noise shaping so that a spectrum of said second signal has zeros at substantially that frequencies which are an integer multiple of N*F.

11. The converter of claim 5 wherein said delta-sigma modulator has M=2 accumulators identified hereinafter as first accumulator and second accumulator, wherein said feedback unit sends said second signal to said first accumulator with a delay of N periods 1/F and wherein said feedback unit sends said second signal to said second accumulator with a delay shorter than the duration of a period (1/F) multiplied by N.

12. The converter of claim 11 wherein said feedback unit sends said second signal to said second accumulator with an attenuation factor k.

13. The converter of claim 12 wherein $1 \approx < k \approx < 2$.

14. The converter of claim 11 wherein said feedback unit send said second signal to said second accumulator with a delay of a single period 1/F.

15. The converter of claim 5 wherein said multiplexer transfers said second signal sequentially.

16. The converter of claim 5 wherein said first signal is a multibit signal and said second signal is a single bit signal.

17. A system comprising:
   a first circuit in which a number of controllable signal sources periodically receive the same number of control signals $V_n$ from a control signal stream V and provide the same number of signal components $W_n$ (n=0 to N-1) to provide an output signal Y, wherein neighboring sources receiving an identical control signal $V_n=V_{n-1}$ provide signal components $W_n$ and $W_{n+1}$ with substantially equal transfer functions but with mismatch differences $\Delta W = W_n - W_{n+1}$; and
   a second circuit modulating an input signal X to said control signal stream V such to introduce zeros in the modulator noise of signal stream V to substantially cancel the influence of said differences $\Delta W$ to a spectrum of said output signal, said zeros occurring at tone frequencies $f_q = q * F/N$, with q being an integer factor, F being a sampling rate of said signal X, and N being the number of controllable signal sources.

18. The system of claim 17 wherein
   (a) said controllable sources are digital-to-analog converters; and
   (b) said first circuit further comprises a commutator which receives said control signal stream and multiplexes said control signal stream to provide said control signals $V_n$.

19. The system of claim 17 wherein said second circuit is a Mth order delta-sigma modulator with M integrator units and a feedback unit providing an input signal for said first circuit, wherein one of said integrator units has a transfer function with the factor $1/(1-z^{-N})$ wherein N is said number of controllable signal sources and wherein said feedback unit provides a delay of N multiplied with a sampling period 1/F.

20. A method for converting a digital input signal to an analog output signal, said method comprising the following steps:
   receiving said digital input signal X with a first sampling rate F and providing a digital intermediate signal V, thereby providing noiseshaping with zeros at substantially integer multiples of said first sampling rate divided by an oversampling ratio N;
   cyclically distributing said digital intermediate signal V to lines whose number N corresponds to the oversampling ratio;
   receiving said intermediate signal V during N sampling periods and providing analog intermediate signals; and
   adding said analog intermediate signals to provide an analog output signal Y.

* * * * *